(12) United States Patent
Teng et al.

(10) Patent No.: US 7,855,577 B1
(45) Date of Patent: Dec. 21, 2010

(54) USING A SINGLE BUFFER FOR MULTIPLE I/O STANDARDS

(75) Inventors: Chai Yee Teng, Sarikei (MY); Ket Chiew Sia, Bayan Lepas (MY)

(73) Assignee: Altera Corporation, San Jose, CA (US)

(\*) Notice: Subject to any disclaimer, the term of this patent is extended or adjusted under 35 U.S.C. 154(b) by 0 days.

(21) Appl. No.: 12/269,149

(22) Filed: Nov. 12, 2008

(51) Int. Cl.
*H03K 19/094* (2006.01)
*H03K 19/0175* (2006.01)

(52) U.S. Cl. .............................. 326/86; 326/82; 326/37; 326/90

(58) Field of Classification Search ............. 326/37–38, 326/41, 56–58, 82–86, 90; 327/108–112
See application file for complete search history.

(56) References Cited

U.S. PATENT DOCUMENTS 6,218,858 B1 \* 4/2001 Menon et al. .................. 326/39
6,243,776 B1 \* 6/2001 Lattimore et al. ........... 710/104

OTHER PUBLICATIONS

Rhyne, Fundamentals of Digital Systems Design, N.J., 1973, pp. 70-71.\*

\* cited by examiner

*Primary Examiner*—Anh Q Tran
(74) *Attorney, Agent, or Firm*—Martine Penilla & Gencarella, LLP

(57) ABSTRACT

A buffer circuit for using one buffer for multiple differential I/O standards is disclosed. The buffer circuit includes a differential input buffer. The first input of the differential input buffer may receive an input and the second input is coupled to a switch. The switch may be a one-time-programmable switch. The switch has a coupling to transmit a signal to the second input of the differential input buffer. The switch may be programmed to selectively transmit different signals to the differential input buffer. The first input terminal of the switch may receive an inverted version of the input signal and the second input terminal of the switch may receive a reference voltage. The buffer may transmit an LVDS signal or an SSTL signal or an HSTL signal. Using one differential buffer for multiple I/O standards may reduce the overall die size and may save space on the die.

26 Claims, 5 Drawing Sheets

USING A SINGLE BUFFER FOR MULTIPLE I/O STANDARDS

BACKGROUND

1. Description of the Related Art

The present invention relates generally to circuitry. More particularly, it relates to an input buffer circuit capable of buffering signals that comply with any one of multiple I/O standards (e.g. LVDS, SSTL and HSTL).

Many integrated circuits support a variety of differential and single-ended I/O standards and interface with backplane, processors, busses, and memory devices, among other things. Some of these standards include LVDS, SSTL and HSTL. LVDS (Low Voltage Differential Signaling), LVPECL (low-voltage positive emitter-coupled logic), and CML (current-mode logic) are commonly used differential I/O standards in high-speed systems. These differential I/O standards are commonly used because they have higher performance, better noise margins, lower electromagnetic interference (EMI), and lower power consumption. LVDS for example, is a low noise, low power and high speed I/O interface. LVDS uses differential signals without a reference voltage. An LVDS buffer has two input signals and the voltage difference between the two signals defines the logic state of the LVDS signal at any one time.

Differential SSTL (Stub Series Terminated Logic) is a memory bus standard used for applications such as high-speed double data rate (DDR) SDRAM interfaces. The differential SSTL I/O standard is similar to voltage referenced SSTL and requires two differential inputs with an external termination voltage. In other words, unlike the LVDS, the SSTL input threshold is defined by an external reference voltage.

Known integrated circuits that support various differential I/O standards have a different I/O buffer for each of these standards. For example, two dedicated input buffers are used to accommodate LVDS and SSTL signals in a device. However, having a dedicated buffer for each I/O standard takes up space and this has increasingly become a dominant factor in digital designs as ICs become smaller and smaller.

Using one buffer for multiple I/O standards instead of using a dedicated buffer for each I/O standard saves space on the device. Using one buffer for multiple I/O standards can also potentially increase the overall efficiency of ICs. For example, the resulting netlist of a PLD, with fewer buffers, will be less complex compared to a netlist with more buffers.

Therefore, it is desirable to use a single buffer for multiple differential I/O standards instead of a dedicated buffer for each of these standards. It is also desirable to have a simpler input buffer circuit to save die space.

SUMMARY

Embodiments of the present invention include circuits and techniques for using an input buffer for multiple differential I/O standards.

It should be appreciated that the present invention can be implemented in numerous ways, such as an apparatus, a method or a circuit. Several inventive embodiments of the present invention are described below.

In one embodiment, an input buffer circuit is disclosed. This input buffer circuit has an input buffer with two input terminals. The first input terminal receives a first signal and the second input terminal receives a second signal from a switch. The switch in this buffer circuit is used to select between two different signals. In some embodiments, the switch selects between an inverted version of the first signal and a third signal and transmits the selected signal to the second input terminal of the input buffer.

In another embodiment of the present invention, a method of buffering two types of differential signals with one input buffer is disclosed. The method includes using a first signal as a first input to the one input buffer. The method further includes using a second signal as a second input to the one input buffer when buffering a first type of differential signal. A third signal is used as the second input to the one input buffer when buffering a second type of differential signal. In some embodiments, the first type of differential signal is consistent with the LVDS I/O standard. In other embodiments, the second type of differential signal is consistent with the SSTL or HSTL I/O standard.

In yet another embodiment in accordance with the present invention, a buffer circuit is disclosed. The buffer circuit has a differential amplifier with two input terminals. The first input terminal of the differential amplifier receives a first signal. A switch with a plurality of input terminals is coupled to the second input terminal of the differential amplifier. The switch selects and transmits one of the signals to the second input terminal of the differential amplifier. A logic gate is coupled to the enable terminal of the differential amplifier and the enable terminal of an input buffer. The output of the logic gate selectively enables and disables the differential amplifier and the input buffer. When the differential amplifier is disabled, the input buffer transmits the first signal as an output of the buffer circuit. When the input buffer is disabled, the differential amplifier transmits and outputs a differential signal as the output of the buffer circuit.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

The following embodiments describe circuits and techniques for utilizing one input buffer for multiple I/O standards.

It will be obvious, however, to one skilled in the art, that the present invention may be practiced without some or all of these specific details. In other instances, well-known operations have not been described in detail in order not to unnecessarily obscure the present invention. Embodiments described herein provide techniques for using one single buffer for multiple differential I/O standards.

Figure 1:
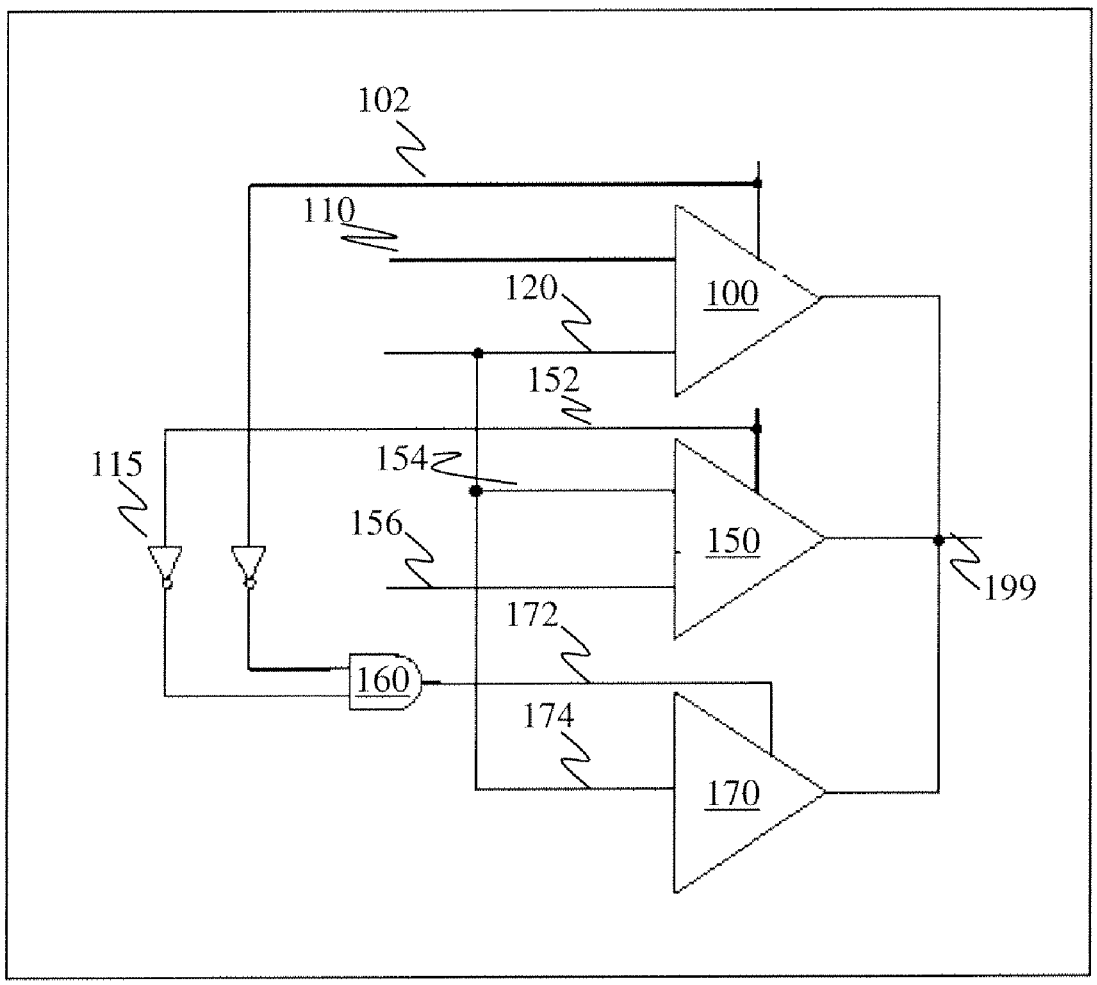
FIG. 1, as an illustrative example, shows a simplified circuit with three dedicated buffers—SSTL/HSTL, LVDS, and TTL.

FIG. 1, as an illustrative example, shows a simplified circuit with three dedicated buffers—SSTL/HSTL, LVDS and TTL. Any number of buffers can be used even though only a few are shown in FIG. 1. As shown in FIG. 1, the SSTL/HSTL buffer 100 has three input terminals. An enable signal is fed into the enable input terminal 102 of the SSTL/HSTL buffer 100. The SSTL/HSTL buffer 100 also has two other input terminals. The first input terminal 110 receives a reference voltage, VREF. The reference voltage used is generally between 1.0V to 3.0V. A second input terminal 120 receives a user input signal. The voltage difference between the first and second input terminals 110 and 120 defines the logic state of the SSTL/HSTL signal.

A dedicated LVDS input buffer 150 is also shown in FIG. 1. This buffer also has three input terminals. The LVDS buffer 150 receives an enable signal with the enable input terminal 152. The first input terminal 154, receives a user input signal, just like the SSTL input terminal 120. However, instead of a reference voltage, the second LVDS input terminal 156 receives a second signal which is an inverted version of the first signal 154. The LVDS buffer 150 outputs a differential signal when enabled.

When both the SSTL/HSTL 100 and LVDS 150 buffers are not enabled, a third buffer, the TTL (Transistor-Transistor Logic) buffer 170 is enabled. The TTL buffer 170 has an enable terminal 172 and an input terminal 174. The AND gate 160 selectively enables the TTL buffer 170 when both the SSTL/HSTL buffer 100 and the LVDS buffer 150 are disabled. Inverters 115 are used to invert the enable signals for buffers 100 and 150 going into the AND gate 160. The input terminal 174 of the input buffer 170 receives the same input as the input terminals 110 and 154 of the SSTL/HSTL buffer and the LVDS buffer respectively. The output of the buffers 100, 150 and 170 are coupled together as a single output 199. At any one time, one of the buffers 100, 150 or 170 will be enabled and the output 199 will carry the output of that buffer.

Figure 2:
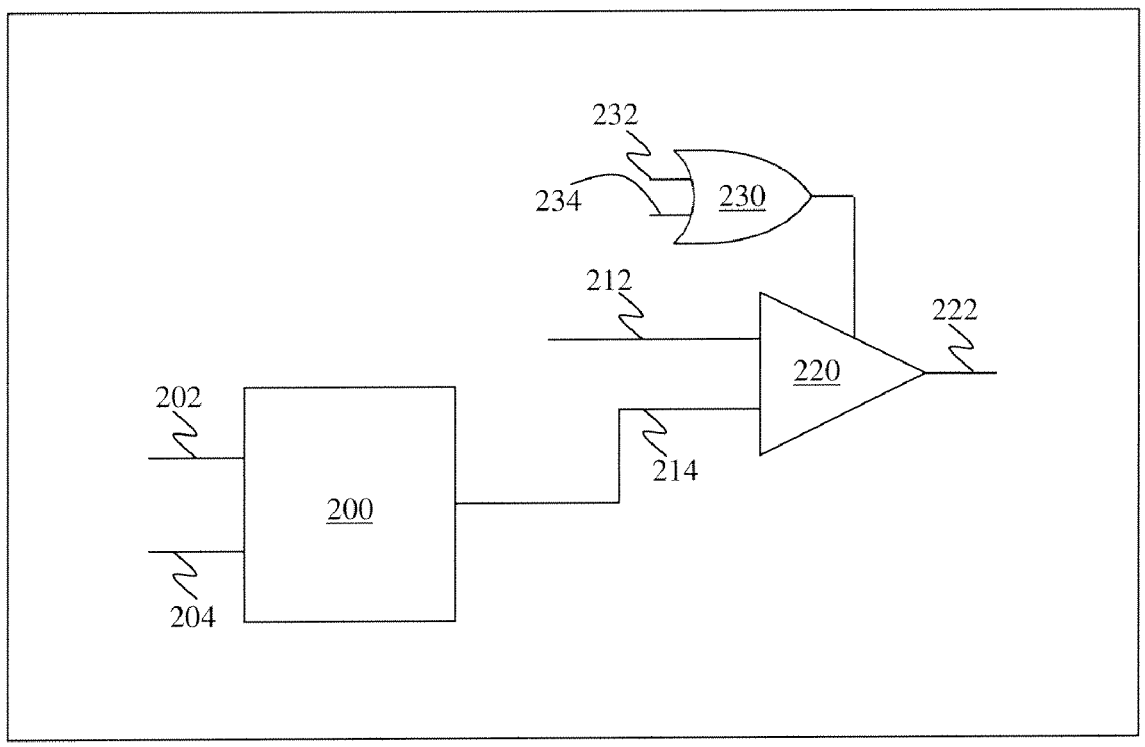
FIG. 2 shows a simplified circuit block diagram of a switch coupled to an input buffer in accordance with an embodiment of the present invention.

FIG. 2 shows a simplified circuit block diagram of a switch coupled to an input buffer in accordance with an embodiment of the present invention. A buffer 220 is used to support different types of differential I/O standards. In some embodiments, the buffer 220 acts as an LVDS input buffer. In other embodiments, the buffer 220 is a differential HSTL or differential SSTL input buffer. A first input terminal 212 of the buffer 220 receives an input signal. The input signal received by the input terminal 212 may be a user input signal. A logic gate 230 with two input terminals is coupled to the enable terminal of the buffer 220. The logic gate 230 enables and disables the buffer 220 based on the inputs received by input terminal 232 and input terminal 234 of the logic gate 230. In some embodiments, if one of the input terminals 232 or 234 receives a high signal, the buffer 220 will be enabled, and if both terminals 232 and 234 receive a low signal, the buffer 220 will be disabled. Therefore, even though an OR gate 230 is shown in FIG. 2, one skilled in the art should appreciate that an XOR gate could also be used.

A switch 200 is coupled to a second input terminal 214 of the buffer 220. In certain embodiments, the input terminal 202 of the switch receives the inverted version of the signal received by the input terminal 212, and the input terminal 204 receives a reference voltage in the range of 1.0V-2.5V. The switch 200 can be programmed to transmit the first signal received by the first input terminal 202 or the second signal received by the second input terminal 204. The switch selects the first signal as the second input 214 to the buffer 220 when buffering an LVDS signal and selects the second signal as the second input 214 to the buffer 220 when buffering a differential SSTL or HSTL signal. In some embodiments, the switch 200 is a one-time-programmable switch. In other embodiments, the switch 200 is a reprogrammable switch.

The switch 200 selects between two inputs. In some embodiments, the switch makes a selection based on the inputs of the logic gate 230. As an example embodiment, the input terminal 232 of the logic gate 230 may receive an LVDS enable signal and the input terminal 234 of the logic gate 230 may receive an SSTL or HSTL enable signal. Based on this example, the switch will select the first signal received by the input terminal 202 when the LVDS enable signal at the input terminal 232 is a logic '1'. Similarly, the switch will select the second signal received by the input terminal 204 when the SSTL or HSTL enable signal at the input terminal 234 is a logic '1'. Thus, in some embodiments, the selection of the switch 200 is based on the inputs 232 and 234 of the logic gate 230 and is consistent with the selected type of differential signal. The output 222 of the buffer 220 will carry the appropriate output signal based on the selected type of differential signal. The circuit as shown in FIG. 2 can also be integrated into an IC and the first signal received by the first input terminal 212 of the buffer 220 may come from a pin on the IC.

Figure 3:
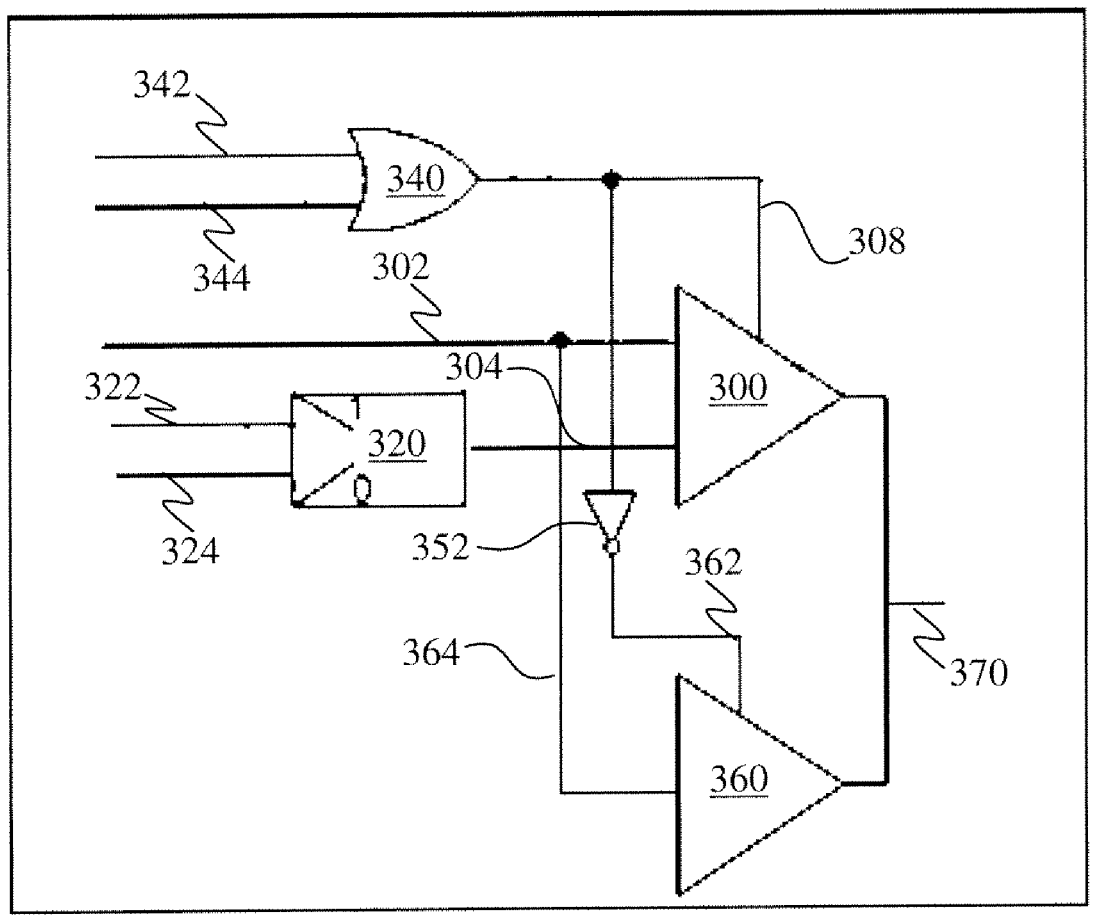
FIG. 3, meant to be illustrative and not limiting, shows a switch and a logic gate coupled to a differential amplifier and a buffer in accordance with another embodiment of the present invention.

FIG. 3, meant to be illustrative and not limiting, shows a switch 320 and a logic gate 340 coupled to a differential amplifier 300 and a buffer 360 in accordance with another embodiment of the present invention. The first input terminal 302 receives an input signal IN. The IN signal may originate from a source external to the circuit. The second input terminal 304 of the differential amplifier 300 is coupled to a switch 320. The switch 320 receives a plurality of signals and selectively transmits one of the signals to the second input terminal 304. In certain embodiments, the switch 320 has two input terminals and selects between two different signals as shown in FIG. 3. The first input terminal 322 of the switch 320 receives an inverted version INA of the input signal IN. The second input terminal 324 of the switch 320 receives a reference voltage VREF. In some embodiments, the reference voltage is between 1.2 Vccn to 2.5 Vccn. When the differential amplifier 300 is transmitting an LVDS differential signal, the switch will select and transmit the INA signal from the first input terminal 322 of the switch 320 to the second input terminal 304 of the differential amplifier 300. Accordingly, when the differential amplifier 300 is transmitting an SSTL or HSTL differential signal, the switch will select and transmit the reference voltage from the second input terminal 324 of the switch 320 to the second input terminal 304 of the differential amplifier 300.

A logic gate 340 is also coupled to an enable terminal 308 of the differential amplifier 300. As shown in FIG. 3, a two-input OR gate 340 receives two enable signals (e.g., LVDSIE and SSTLIE) with two input terminals 342 and 344 to selectively enable the differential amplifier 300. Table 1 below shows the output of the OR gate 340 based on the inputs to input terminals 342 and 344. When both the inputs to input terminals 342 and 344 are disabled, the differential amplifier 300 is disabled. In some embodiments, both the inputs to input terminals 342 and 344 are disabled when they receive a '0' as an input, as shown in Table 1. When, in the embodiment illustrated in Table 1, the LVDSIE signal is set to high (i.e. when LVDSIE is a '1'), then the differential amplifier 300 is enabled and the switch 320 selects the inverted version INA 322 as the second input 304 to the differential amplifier 300. When, in the embodiment illustrated in Table 1, the SSTLIE signal is set to high (i.e. when SSTLIE is a '1'), then the differential amplifier 300 is enabled and the switch 320 selects the reference voltage VREF 324 as the second input 304 to the differential amplifier 300.

Even though an OR gate would generally output a '1' when at least one of its inputs is high, this does not happen because an I/O pin cannot simultaneously support conflicting I/O standards. Therefore, even though an OR gate 340 is shown in FIG. 3, one skilled in the art should appreciate that an XOR gate or any similar logic component that produces a high output whenever at least one or exactly one of the inputs is high can be used to control the enable signal to the differential amplifier 304. Additional circuitries that govern this behavior are not shown in order to not obscure the present invention.

TABLE 1

| SSTLIE | LVDSIE | Differential Amplifier | Switch |
|---|---|---|---|
| 0 | 0 | Disabled | N/A |
| 0 | 1 | Enabled | INA |
| 1 | 0 | Enabled | VREF |
| 1 | 1 | N/A | N/A |

As shown in FIG. 3 and Table 1, the OR gate 340 selectively enables and disables the differential amplifier 300 and the buffer 360 based on the input signals received by input terminals 342 and 344 respectively. When the differential amplifier 300 is disabled, the buffer 360 is enabled. In some embodiments, the buffer 360 is a TTL buffer. The output of the OR gate 340 is inverted with an inverter 352 and coupled to the enable terminal 362 of the buffer 360. Therefore, when both the inputs to input terminals 342 and 344 are low, the differential amplifier 300 will be disabled and the buffer 360 will be enabled. When either one of the inputs to input terminals 342 and 344 is high, the differential amplifier 300 will be enabled and the buffer 360 will be disabled. The input terminal 364 of the buffer 360 receives an input signal IN. In some embodiments, this input signal is the same input as the one received by the input terminal 302 of the differential amplifier 300. The output of the buffer 360 and the output of the differential amplifier 300 are coupled as a single output 370 of the circuit.

Figure 4:
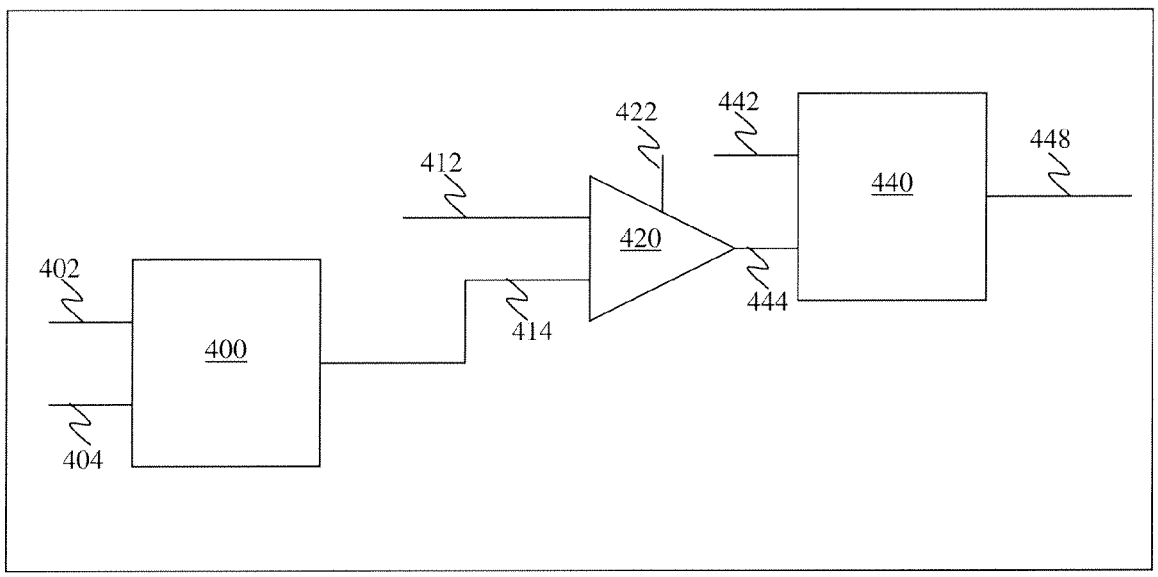
FIG. 4, meant to be illustrative and not limiting, shows a differential buffer coupled to two switches in accordance with an embodiment of the present invention.

FIG. 4, meant to be illustrative and not limiting, shows a differential buffer coupled to two switches 400, 440 as an embodiment in accordance with the present invention. The switch 400 with two input terminals 402, 404 is coupled to the second input terminal 414 of a differential buffer 420. The first input terminal 402 of the switch receives a first input signal and the second input terminal 404 of the switch receives a second input signal. In some embodiments, the first input signal is an inverted version of the signal received at the first input terminal 412 of the differential buffer 420 and the second signal is a pre-specified reference voltage. The switch 400 can be programmed to selectively output either the signal received by the first input terminal 402 or the signal received by the second input terminal 404. One skilled in the art should also appreciate that even though a switch 400 is shown in FIG. 4, a similar logic element can be used to replace the switch 400. For example, a 2-to-1 multiplexer can be used in place of the switch 400 to selectively transmit one of the two inputs as an input to the differential buffer 420.

As shown in FIG. 4, the differential buffer 420 has two input terminals. The first input terminal 412 receives a first signal and the second input terminal 414 receives a second signal—either an inverted version of the first signal 402 or a reference voltage 404 as output from the switch 400. In some embodiments, the differential buffer 420 is always enabled and the enable terminal 422 is tied to a '1'. In other embodiments, the differential buffer 420 is controlled by other logic elements and is selectively enabled. The output of the differential buffer 420 is coupled to an input terminal 444 of a second switch 440. The second switch 440 has two input terminals 442, 444. The first input terminal 442 receives a first input signal. In some embodiments, the first input signal is the same signal received by the first input terminal 412 of the differential buffer 420. The second input terminal 444 of the second switch 440 receives the output of the differential buffer 420. The switch 440 can be programmed to select between the two inputs. Even though a switch 440 is shown, one skilled in the art should appreciate that a similar logic element like a multiplexer can be used to select between the two signals. The switch 440 will output either the differential signal from the differential buffer 420 or the input signal received by the first input terminal 442 of the switch 440. In some embodiments, the switch 440 is programmed to transmit a differential signal when the switch 440 selects and transmits the output from the differential buffer 420. The output 448 transmits the appropriate output based on the selection of the switch 440.

Figure 5:
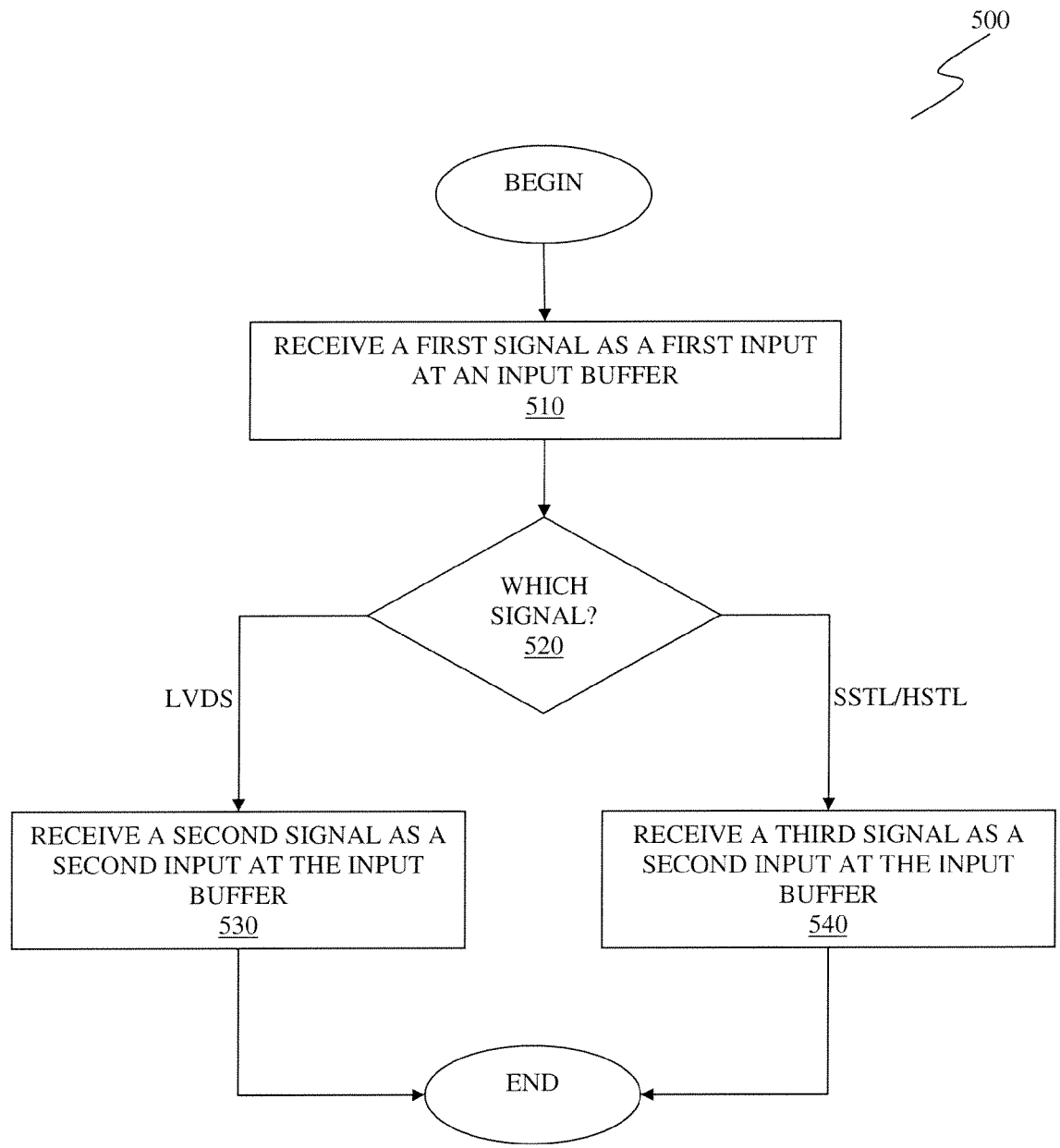
FIG. 5, meant to be illustrative and not limiting, shows a process flow to buffer two types of differential signals using a single input buffer in accordance with an embodiment of the present invention.

FIG. 5, meant to be illustrative and not limiting, shows a process flow 500 to buffer two types of differential signals using a single input buffer in accordance with an embodiment of the present invention. The process starts with an input buffer receiving a first signal as a first input in operation 510. In some embodiments, the first signal is a user input signal. The type of signal that the input buffer is buffering is checked in operation 520. In one embodiment, software can be programmed to check the type of signal that the input buffer is buffering in a user design. In another embodiment, external circuitries that are not shown in order to not obscure the present invention are used to determine the type of signal that the input buffer is buffering. A second signal is received at the input buffer as a second input in operation 530 when the input buffer is buffering an LVDS signal. In some embodiments, the second signal is an inverted version of the first signal. A third signal is received at the input buffer as a second input in operation 540 when the input buffer is buffering an SSTL or an HSTL signal, as illustrated in FIG. 3. In certain embodiments, the third signal is a reference voltage within the range of 1.2VCCN to 2.5VCCN. However, this is meant to be exemplary and not limiting. The buffer can also receive a fourth signal as an enable input to the buffer, as illustrated in FIG. 3. The enable signal will enable or disable the buffer based on the value of the fourth signal. In a preferred embodiment, the enable signal corresponds to the type of signal that the input buffer is buffering at any one time.

Although the method operations were described in a specific order, it should be understood that other operations may be performed in between described operations, or described operations may be adjusted so that they occur at slightly different times, or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A buffer circuit, comprising:
    an input buffer having first and second input terminals, wherein the first input terminal receives a first signal;
    a switch to transmit a second signal to the second input terminal of the input buffer, the switch having first and second input terminals to receive an inverted version of the first signal and a third signal representing a reference voltage, respectively, wherein the switch selects between the inverted version of one of the first signal or the third signal for the second signal; and
    a second switch, the second switch having first and second input terminals to receive the first signal and an output of the input buffer, respectively, wherein a selection by the second switch determines whether an output of the buffer circuit is based on the first signal or the output of the input buffer.

2. The buffer circuit of claim 1, further comprising:
    a logic gate, wherein a relationship between inputs to the logic gate corresponds to a relationship of the inputs to the selection switch and wherein an output of the logic gate enables and disables the input buffer.

3. The buffer circuit of claim 2, wherein the logic gate is one of an OR gate or an XOR gate.

4. The buffer circuit of claim 1, wherein the buffer circuit is integrated into an integrated circuit and wherein the first signal originates from a source external to the integrated circuit.

5. The buffer circuit of claim 1, further comprising:
    another input buffer.

6. The buffer circuit of claim 5, wherein when the input buffer is enabled, the another input buffer is disabled.

7. The buffer circuit of claim 5, wherein when the another input buffer is enabled, the input buffer is disabled.

8. The buffer circuit of claim 5, wherein an input to the another input buffer is the first signal.

9. The buffer circuit of claim 5, further comprising:
    a logic gate, wherein an output of the logic gate enables and disables the another input buffer.

10. The buffer circuit of claim 5, wherein an output terminal of the input buffer and an output terminal of the another input buffer are coupled.

11. The buffer circuit of claim 1, further comprising a logic gate, wherein input to the logic gate corresponds to the selections by the first and second switch.

12. The buffer circuit of claim 1, further comprising a logic gate, wherein input to the logic gate corresponds to the selection by the second switch.

13. The buffer circuit of claim 1, wherein the input buffer is a differential amplifier.

14. A method of buffering first and second types of differential signals with one input buffer, comprising:
    receiving a first signal at the one input buffer, wherein the first signal is consistent with the first and second types of differential signals;
    receiving a second signal as a second input at the one input buffer when buffering the first type of differential signal, wherein the second signal is inconsistent with the second type of differential signal;
    receiving a third signal as the second input at the one input buffer when buffering the second type of differential signal; and
    receiving a fourth signal at the one input buffer to enable and disable the one input buffer, wherein a logical value of the fourth signal corresponds to whether the second signal or the third signal is being used as the second input.

15. The method of claim 14, wherein the third signal is inconsistent with the first type of differential signal.

16. The method of claim 14, wherein the first type of differential signal is consistent with an LVDS I/O standard.

17. The method of claim 14, wherein the second type of differential signal is consistent with an SSTL I/O standard.

18. The method of claim 14, wherein the second type of differential signal is consistent with an HSTL I/O standard.

19. The method of claim 14, wherein the second signal comprises an inverted version of the first signal.

20. The method of claim 14, wherein the third signal comprises a reference voltage.

21. The method of claim 14, wherein when the one input buffer is enabled a second input buffer is disabled and when the one input buffer is disabled the second input buffer is enabled and transmits the first signal.

22. The method of claim 14, further comprising:
    receiving the first signal as a first input to a switch, wherein the switch selects the first signal when buffering a third type of differential signal, wherein the third type of differential signal is inconsistent with the first and second types of differential signals; and
    receiving an output of said one input buffer as a second input to the switch, wherein the switch selects the second signal when buffering the first and second types of differential signals.

23. A buffer circuit, comprising:
    a differential amplifier having first and second input terminals, wherein the first input terminal receives a first signal;
    a switch with a plurality of input terminals to receive a plurality of signals, wherein the switch makes a selection to transmit one of the plurality of signals to the second input terminal of the differential amplifier;
    an input buffer having an input terminal to receive the first signal;
    a logic gate, wherein an output of the logic gate enables and disables the differential amplifier and the input buffer, respectively, wherein the input buffer transmits the first signal as an output of the buffer circuit when the differential amplifier is disabled and wherein the differential amplifier transmits a differential signal as the output of the buffer circuit when the differential amplifier is enabled; and
    an inverter receiving the output of the logic gate.

24. The buffer circuit of claim 23, wherein the output of the logic gate corresponds to the selection by the switch circuit.

25. The buffer circuit of claim 23, wherein the logic gate is a single logic gate enabling and disabling both the differential amplifier and the input buffer.

26. The buffer circuit of claim 25, wherein the output of the inverter is transmitted to the input buffer.

* * * * *